United States Patent [19]

Yamashita

[11] Patent Number: 5,757,200
[45] Date of Patent: May 26, 1998

[54] LEAD PRESS MECHANISM FOR IC TEST HANDLER

[75] Inventor: Kazuyuki Yamashita, Kasukabe, Japan

[73] Assignee: Advantest Corp., Tokyo, Japan

[21] Appl. No.: 617,022

[22] Filed: Mar. 18, 1996

[30] Foreign Application Priority Data

Mar. 16, 1995 [JP] Japan ................... 7-084800

[51] Int. Cl.$^6$ .................................................. G01R 31/02
[52] U.S. Cl. ............................................ 324/757; 324/755
[58] Field of Search .............................. 324/757, 758, 324/754, 755, 760, 761

[56] References Cited

U.S. PATENT DOCUMENTS

| | | |
|---|---|---|
| 4,839,587 | 6/1989 | Flatley et al. ................. 324/761 |
| 5,172,049 | 12/1992 | Kiyokawa et al. .............. 324/755 |

Primary Examiner—Ernest F. Karlsen
Attorney, Agent, or Firm—Muramatsu & Associates

[57] ABSTRACT

A lead press mechanism is suitable for a self-drop type test handler for establishing an electrical contact between the lead terminals of IC devices to be tested and the contact terminals without deforming the lead terminals or adversely affecting the IC device testing. The lead press mechanism especially suitable for testing mold-framed IC devices. The lead press mechanism includes an IC device interface assembly for interfacing an IC device to be tested with an IC tester through IC socket terminals to provide test signals from the IC tester to the IC device and to send resulting output signals from the IC device to the IC tester; a lead press assembly having a guide mechanism including a contact rail for guiding the IC device in a vertical direction to a predetermined test position, a lead press for pressing lead terminals of the IC device against the IC socket terminals by protruding beyond the contact rail, and an elastic member which allows the lead press an additional movement against the force of the elastic member; and a distance mechanism for determining a distance between the IC device interface assembly and the lead press assembly when the when IC device interface assembly and the lead press assembly engage with each other.

18 Claims, 3 Drawing Sheets

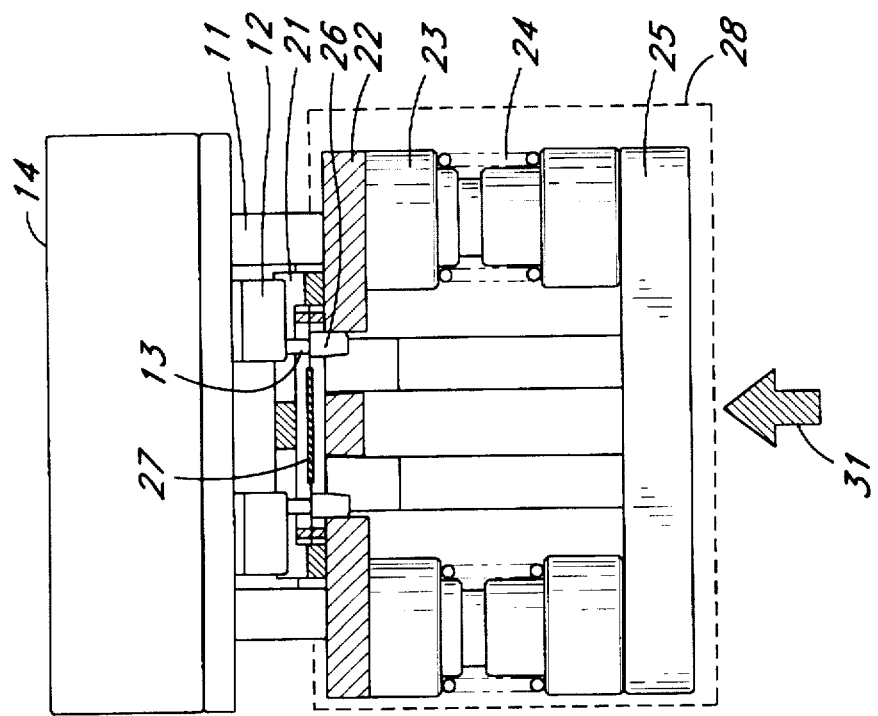
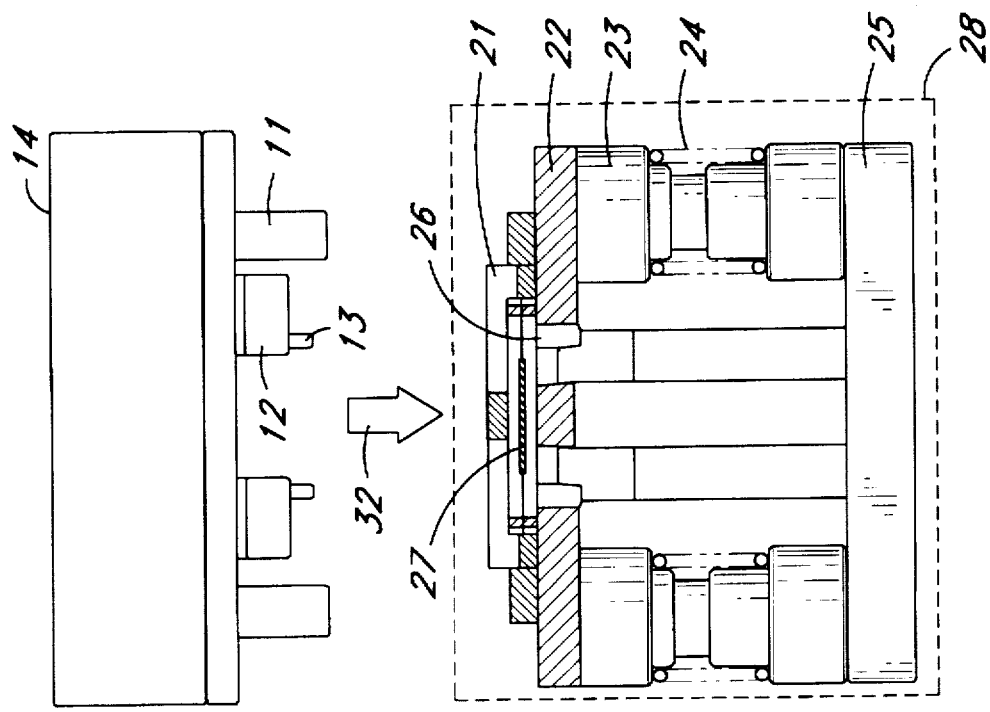

LEAD PRESS MECHANISM FOR IC TEST HANDLER

FIELD OF THE INVENTION

This invention relates to a lead press mechanism to be used in a test handler for pressing lead terminals of IC devices against contact terminals which interface with an IC tester to test the IC devices, and more particularly, to a lead press mechanism suitable for a self-drop type test handler for establishing an electrical contact between the lead terminals of IC devices and the contact terminals without deforming the lead terminals or otherwise affecting adversely the IC device testing. The lead press mechanism of the present invention further accomplishes an ideal electrical coupling between lead terminals of mold-framed IC devices and the contact terminals.

BACKGROUND OF THE INVENTION

In testing IC devices, an automatic test handler is frequently used in combination with an IC tester to automatically provide IC devices to be tested to a test position of the IC tester. There are generally two types of test handlers, a self-drop type wherein IC devices are transferred in a vertical direction and a tray type wherein IC devices are transferred in a horizontal direction. In a self-drop type test handler, each of the IC devices is prepared at a higher position of the test handler and transferred to the test position by sliding downward by its own gravity.

In such a self-drop type test handler, there has been a need to prepare a lead press mechanism to fit each IC device lead shape in an IC tester lead press assembly to measure characteristics of the IC device by using the IC tester. In other words, a lead press mechanism in the prior art has no choice other than to match the formed shape of the lead terminals of the IC device, since the IC device characteristic measurements are taken after the leads have been formed to a specific shape.

FIG. 3 is a cross sectional plan view showing an example of a conventional lead press mechanism. In FIG. 3, the lead press mechanism includes a guide 41, a contact rail 43, a lead press 44, an IC socket 46 and IC socket terminals 47. An IC device 42 to be tested is positioned between the guide 41 and the contact rail 43 so that the IC device 42 slides down while being guided by the guide 41 and the contact rail 43. Lead terminals 45 of the IC device 42 are arranged between the IC socket terminals 47 and the lead press 44.

In the arrangement of FIG. 3, the IC device is transferred in a vertical direction (from the front to rear of this paper) by its weight until it is stopped by a stopper (not shown) at a specific test position. According to the example of FIG. 3, the lead press 44 is fixed to the contact rail 43. The IC socket terminals 47 press the lead terminals 45 toward the contact rail to establish electrical contact between the IC socket terminals 47 and the lead terminals 45. In other types of IC tester handlers, an IC device carrier may be used, and the lead press 44 is built in the carrier as a single assembly.

In the IC device test procedure of the conventional mechanism such as the one shown in FIG. 3, the preformed lead terminals 45 of IC device 42 lightly contact the lead press 44 and slide thereon as the IC device 42 moves downward. Thus, there arises problems such as deformation (bending) of the lead terminals of IC devices which may damage the IC devices. Other problem is an accumulation of soldering material to the lead press 44 transferred from the lead terminals 45, thereby causing a connection failure between the lead terminals 45 and the IC socket terminals 47 when testing the IC devices.

Moreover, in the prior art described above, for testing a mold-framed type IC device 27 (FIG. 2) which has recently been put in the market, a mold-frame 48 prevents a normal operation of the lead press mechanism. Thus, the mold-frame type IC devices are not possible to be tested by the conventional test handler without being deformed in the mold-frame. Since a mold-framed IC device is a new type of device that will be widely used in the industry, there is a need to provide a lead press mechanism which is capable of solving this problem.

As noted above, in the self-drop type IC tester handler, an IC device slides on the lead press which comprises a contact part and stops at a specific position. Therefore, even the lead press is so designed to fit the formed IC terminals, and problems such as the deformation of the lead terminals or accumulation of the soldering material to the lead press by abrasive actions still tend to occur when the IC device slides on the lead press.

In addition, for IC devices having a molding frame surrounding IC device lead terminals, the lead terminals may be deformed if the conventional lead press mechanism is applied without modifications. Thus, it was not possible to test the mold-framed IC devices by the conventional lead press mechanism.

SUMMARY OF THE INVENTION

Therefore, it is an object of the present invention to provide a lead press mechanism which is capable of transferring IC devices to a test position and pressing lead terminals of the IC devices without deforming the lead terminals of the IC devices.

It is another object of the present invention to provide a lead press mechanism which is capable of establishing an electrical contact between lead terminals of IC devices to be tested and IC socket terminals without being affected by the problems of bending the lead terminals of the IC devices.

It is a further object of the present invention to provide a lead press mechanism which is capable of establishing an electrical contact between lead terminals of IC devices to be tested and IC socket terminals without being affected by the problems of transferring solder materials from the lead terminals to the lead press.

It is a further object of the present invention to provide a lead press mechanism which is capable of establishing an electrical contact between lead terminals of mold-framed IC devices and IC socket terminals to test the mold-framed IC devices.

The lead press mechanism of the present invention is to be used in a test handler for pressing lead terminals of IC devices against contact terminals, i.e., an IC device interface which interfaces IC devices with an IC tester to test the IC devices. The lead press mechanism is suitable for a self-drop type test handler for establishing electrical contact between the lead terminals of IC devices to be tested and the contact terminals without deforming the lead terminals or adversely affecting the IC device testing. The lead press mechanism of the present invention further accomplishes ideal electrical coupling between lead terminals of mold-framed IC devices and the contact terminals.

The lead press mechanism of the present invention includes; an IC device interface assembly for interfacing an IC device to be tested with an IC tester through IC socket terminals to provide test signals from the IC tester to the IC device and to send resulting output signals from the IC device to the IC tester; a lead press assembly having a guide mechanism which includes a contact rail for guiding the IC device in a vertical direction to a predetermined test position, a lead press for pressing lead terminals of the IC device against the IC socket terminals when the IC device is placed at the test position by protruding toward the IC device beyond the contact rail, and an elastic member which allows the lead press an additional movement against the force of the elastic member; and a distance mechanism for determining a distance between the IC device interface assembly and the lead press assembly when the when IC device interface assembly and the lead press assembly engage with each other.

In the present invention, the IC device interface assembly and the lead press assembly are separated when the IC device slides in the vertical direction to the test position in the test handler, and the IC device interface assembly and the lead press assembly are engaged with each other when the IC device receives the test signal from the IC tester at the test position.

The distance mechanism first engages with the lead press assembly when the IC device interface assembly and the lead press assembly come close together, the distance mechanism restricts the lead press assembly from further approaching toward the IC device interface assembly.

The lead press protrudes beyond the contact rail against the force of the spring when the lead press assembly is further pressed toward the IC device interface assembly after being restricted its movement by said distance mechanism thereby forming electrical contact between the lead terminals of the IC device and the IC socket terminals.

According to the present invention, the problems involved in the conventional lead press mechanism are completely solved. In the conventional technology, there is a problem in that the mold-framed IC device can not be tested without deforming the lead terminals. Namely, since the mold-frame IC device has a mold frame which surrounds the lead terminals, the lead terminals will be deformed or damaged if the conventional lead press mechanism is applied. Further, even if the lead press is so designed to fit the shape of the lead terminals, the lead terminals tend to be deformed because the lead terminals slide on the lead press. Further, since the lead terminals slide on the lead press, the soldering material on the lead terminal is transferred and accumulated on the lead press which causes a contact failure.

According to the present invention, the lead press mechanism is designed in such a way that an IC device never contacts the lead press until the IC device stops at the test location after being vertically guided. The lead press and the IC device terminals contact each other only when the lead press assembly is shifted in the horizontal direction. Thus, any type of lead terminals can be accommodated by the present invention, such as the mold-framed IC device, or IC devices of non-formed or formed terminals, and the shape of IC devices can be arbitrary.

Since the lead terminals of the IC device to be tested will not contact the lead press during the process of sliding to the test position, the solder material will not be abraded from the lead terminals of IC devices. Thus, there is no accumulation of the solder material on the lead press. Thus, it is possible to accomplish the electric contact with high reliability.

BRIEF DESCRIPTION OF THE DRAWINGS

FIG. 1A is a cross sectional plan view of the lead press mechanism of the present invention showing a state where an IC device transferred to a specific position prior to establish electric contact between the IC device and IC device interface.

FIG. 1B is a cross sectional plan view of the lead press mechanism of FIG. 1A showing a state where the lead terminals of the IC device are pressed against the IC socket terminals to establish electrical contact therebetween.

DETAILED DESCRIPTION OF THE PREFERRED EMBODIMENT

Figure 3:
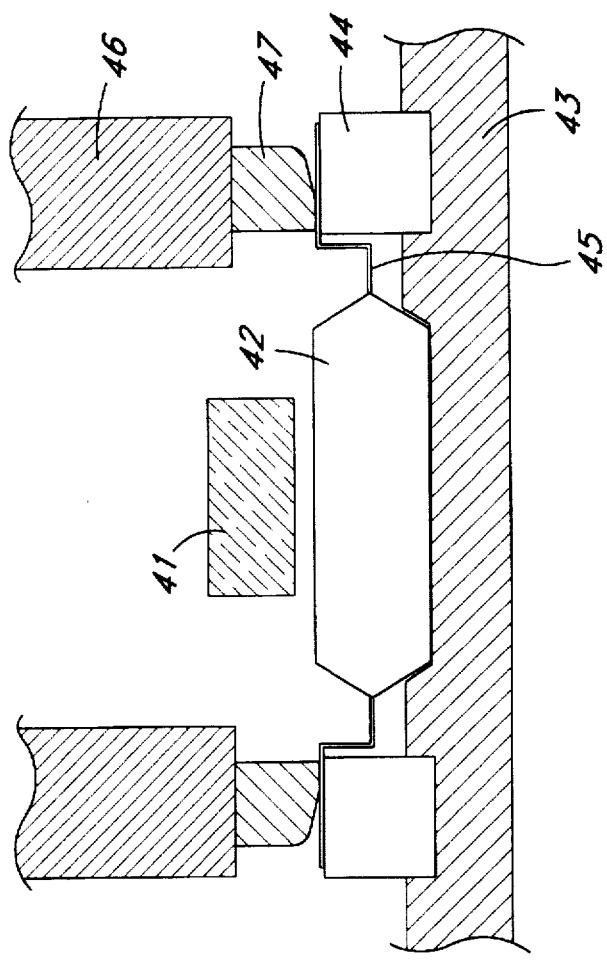
FIG. 3 is a cross sectional plan view showing an example in the structure of conventional lead press mechanism.
Figure 2A:
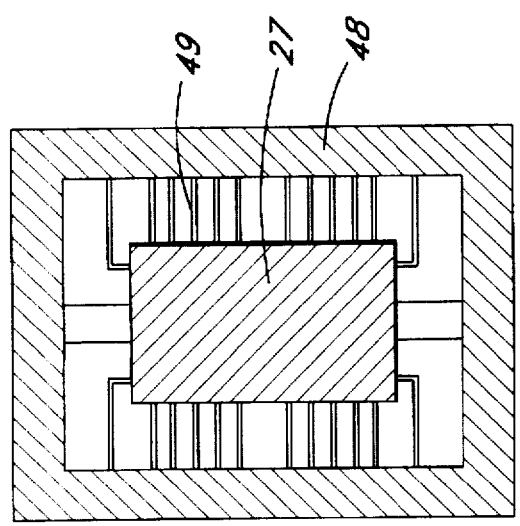
FIG. 2A is a schematic diagram showing a cross-sectional plan view of an example of mold-framed IC device.
Figure 2B:
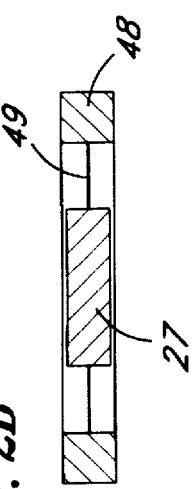
FIG. 2B is a schematic diagram showing a cross-sectional side view of the example of mold-framed IC device of FIG. 2A.

The lead press mechanism of the present invention will be explained with reference to drawings. FIG. 1 is a cross sectional plan view of the lead press mechanism of the present invention. FIG. 1A is a cross sectional plan view of the lead press mechanism of the present invention showing a state where an IC device transferred to a specific position prior to establish electric contact between the IC device and IC device interface. FIG. 1B is a cross sectional plan view of the lead press mechanism of FIG. 1A showing a state where the lead terminals of the IC device are pressed against the IC socket terminals to establish electrical contact therebetween. FIG. 2 shows a schematic view of a mold-framed type IC device which is transferred in the lead press mechanism of the present invention.

The lead press mechanism of FIG. 1 is basically formed of an IC device interface assembly 14 and a lead press assembly 28. The IC device interface assembly 14 is provided in a test handler at a position appropriate to be connected to a test head of an IC tester when the test handler is coupled with the IC tester. The lead press assembly 18 is provided in the test handler at the same vertical position as the IC device interface assembly 14.

The IC device interface assembly includes a rail pressure 11, an IC socket 12 and IC socket terminals 13. The IC device interface assembly 14 functions as an interface between the IC device to be tested and the IC tester. When testing the IC device, the IC test tester provides test signals to lead terminals of the IC device through the IC device interface assembly 14. The IC device interface assembly 14 receives resulting output signals from the IC device and transmits the output signals to the IC tester for the purpose of evaluation.

The IC socket terminals are provided on the IC socket 12 and have the same pitch as that of the lead terminals of the IC device to be tested. The IC socket terminals 13 directly contact with the lead terminals of the IC device to be tested when pressed by the lead press mechanism of the present invention. The rail pressure 11 is provided to determine the distance between the IC device interface assembly 14 and the lead press assembly 28 when both members are engaged each other as will be described in more detail later.

The lead press assembly 28 includes a contact roof 21, a contact rail 22, a shaft 23, a spring 24, a contact base 25 and a lead press 26. The contact roof 21 and the contact rail 22 form a guide mechanism for an IC device 27 slides therethrough in a vertical direction (perpendicular to the surface of this paper). The contact rail 22 and the contact base 25 are coupled through the spring 24 and the shaft 23. The lead press 26 is directly coupled with the contact base 25. Thus, in this arrangement, the lead press 26 is allowed further movement against the force of the spring 24 when the contact base 25 is further pressed toward the direction of the IC device interface assembly 14.

The IC device 27 in the example of FIG. 1 is a mold-framed IC device as shown in FIG. 2 having lead terminals 49 connected to a surrounding mold frame 48, although other types of IC devices are also applicable to the present invention. The mold-framed IC device 27 is guided along the contact rail 22 and the contact roof 21, to slide down by the gravity from an upper position to a lower position, and is stopped by a stopper (not shown) at a specific test position.

FIG. 1A shows a contact-OFF state in which the lead press assembly 28 is separated from the IC device interface assembly 14 in a horizontal direction shown by an arrow 32. In this state, the IC device 27 shifts from the upper location to the test position by its own gravity. The spring 24 provides a force against the contact rail 22 and the contact base 25 to maintain the predetermined distance therebetween. Thus, in this state, the lead press 26 is not protruded beyond the contact rail 22.

When the mold-framed IC device 27 arrives at the test position, a contact-ON state is reached according to the operation sequence control of the lead press assembly 28. The lead press assembly 28 begins to move in a horizontal direction as shown by an arrow 31 to approach the IC device interface assembly 14 as shown in FIG. 1B.

When the lead press assembly 28 is moved toward the IC device interface assembly 14, the contact roof 21, the contact rail 22, and thus the mold-framed IC device 27 move together in the direction of arrow 31 since the contact roof 21 and the contact rail 22 are fixed together and the IC device 27 is placed within the space formed by the contact rail 22 and the contact roof 21. In this movement, the contact rail 22 first meets the rail pusher 11 whereby the further movement of the contact rail 22 is restricted.

Since the lead press 26 is not directly connected to the contact rail 22 and is fixed on the contact base 25, when the contact base 25 is further pressed in the direction of the arrow 31, the lead press 26 further advances against the force of the spring 14 to protrude beyond the contact rail 22 while the contact rail 22, the contact roof 21, and the mold-framed IC device 27 remain in the same position determined by the rail pressure 11.

Thus, the lead press 26 presses the lead terminals 49 of the IC device 27 against the IC socket terminals 13. The lead terminals 49 of the mold-framed IC device 27 contact both the lead press 26 and IC socket terminals 13 by fitting lead terminals 49 between lead press 26 and IC socket terminals 13. Thus, a reliable electrical connection is established between the lead terminals 49 and IC socket terminals 13 without deforming lead terminals 49.

After testing the IC device 27, according to an operation sequence control of the IC tester, the contact-OFF state of FIG. 1A is reached again. Thus, the lead press assembly 28 is moved in the direction of arrow 32 so that the contact rail 22, the contact roof 21, and the mold-framed IC device 27 are removed together from the IC device interface assembly 14. Then the mold-framed IC device 27 will be ejected to the next process and the lead press mechanism will receive the next IC device to be tested.

According to the present invention, the lead press mechanism is designed in such a way that an IC device never contacts the lead press, until the IC device stops at the test position. The lead press and the IC device terminals contact each other only when the contact rail, the contact roof, and the IC device are shifted in the horizontal direction. Thus, any type of lead terminals can be accommodated by the present invention, such as the mold-framed IC device, or IC devices of non-formed or formed terminals, and the shape of IC devices can be arbitrary.

Figure 4A:
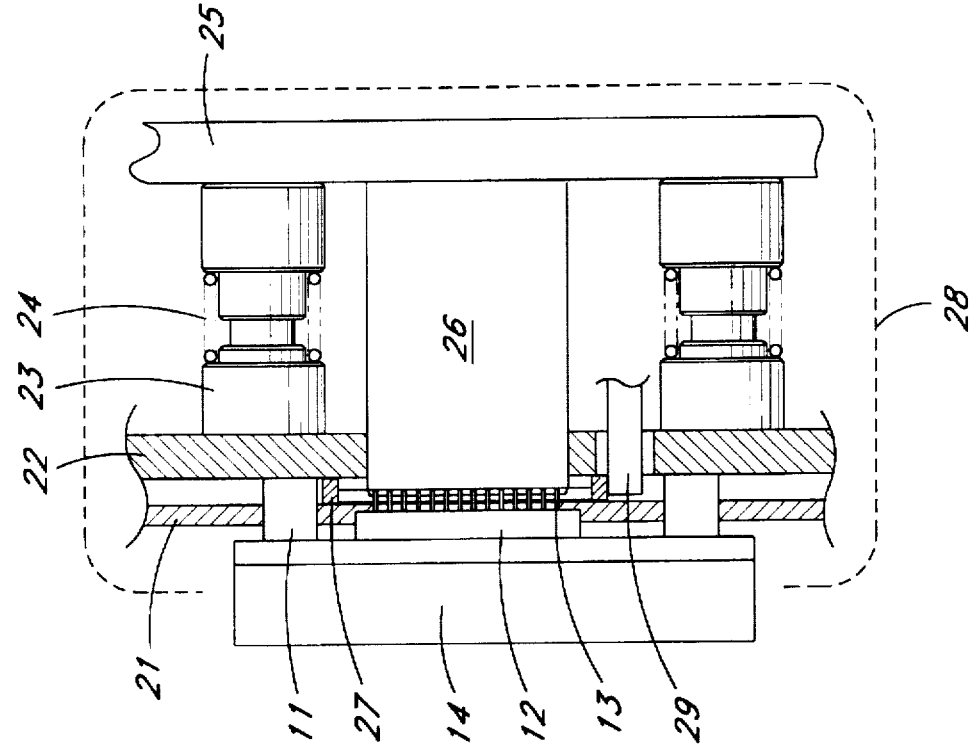
FIG. 4A is a cross sectional side view of the lead press mechanism of FIG. 1 showing a state where the IC device transferred to the specific position prior to establish electric contact between the IC device and the IC device interface.
Figure 4B:
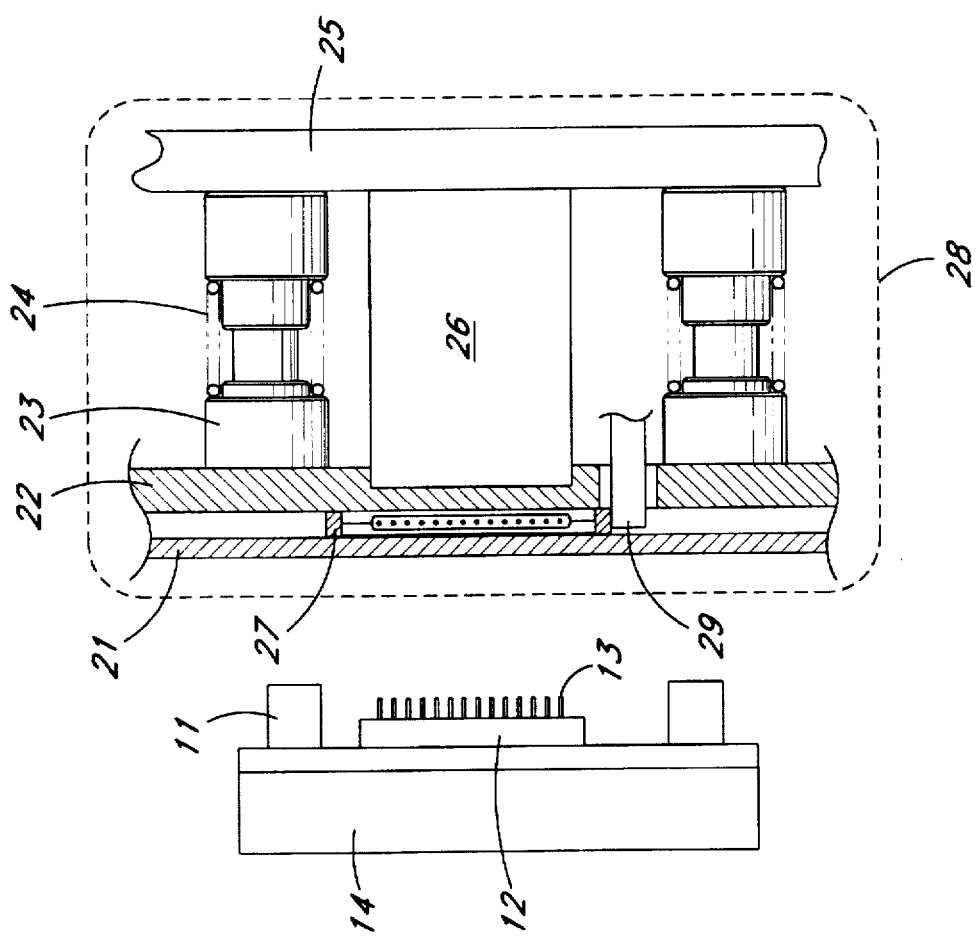
FIG. 4B is a cross sectional side view of the lead press mechanism of FIG. 1 showing a state where the lead terminals of the IC device are pressed against the IC socket terminals to establish electrical contact therebetween.

FIG. 4 is a cross sectional side view of the lead press mechanism of FIG. 1. FIG. 4A shows a state where the IC device transferred to the specific position prior to establish an electric contact between the IC device leads and the IC device interface while FIG. 4B shows a state where the lead terminals of the IC device are pressed against the IC socket terminals to establish the electrical contact therebetween.

FIG. 4A shows the contact-OFF state which corresponds to FIG. 1A in which the lead press assembly 28 is separated from the IC device interface assembly 14 in the horizontal direction (a right-left direction of this paper). In this state, the mold-framed IC device 27 is guided along the contact rail 22 and the contact roof 21 in the vertical direction. The IC device 27 is stopped by a stopper 29 at a specific test position in the test handler. Because of the force of the spring 24, the contact base 25 and the lead press maintain the predetermined distance from the contact rail 22.

When the mold-framed IC device 27 stops at the test position, the contact-ON state is reached wherein the lead press assembly 28 begins to move in the horizontal direction as shown by the arrow 31 toward the IC device interface assembly 14 as shown in FIG. 4B. When the lead press assembly 28 is moved toward the IC device interface assembly 14, the contact roof 21, the contact rail 22, and the mold-framed IC device 27 move together in the direction of arrow 31. The contact rail 22 first hits the rail pusher 11 whereby the further movement of the contact rail 22 is restricted.

When the contact base is further pressed toward the direction of the arrow 31, the lead press 26 further moves against the force of the spring 14 to protrude beyond the contact rail to enter the space formed by the contact rail 22 and the contact roof 21. Thus, the lead press 26 presses the lead terminals 49 of the IC device 27 against the IC socket terminals 13. Therefore, the lead terminals 49 of the IC device 27 are electrically connected to the IC socket terminals 13.

In the foregoing description, the lead press assembly moves toward the IC device interface assembly while the IC device interface assembly is fixed. However, it is apparent that such a movement is a relative one. Thus, it is also possible that the IC device interface moves back and force in the horizontal direction while the lead press assembly is stayed in the test handler.

In the above example, the rail pressure which restricts the movement of the lead press assembly is provided on the IC device interface assembly. However, the rail pressure can be provided separately from the IC device interface assembly.

The embodiment described above includes a mold-framed IC device 27, however, the same embodiment can be applied to other types of IC devices such as an IC device with formed lead terminals.

According to the present invention, the lead press mechanism is designed in such a way that an IC device never contacts the lead press until the IC device stops at the test position after being guided. The lead press and the IC device terminals contact each other only when the contact rail, the contact roof, and the IC device are shifted in the horizontal direction. Thus, any type of lead terminals can be acceptable by the present invention, such as the mold-framed IC device, or IC devices of non-formed or formed terminals, and the shape of IC devices can be arbitrary.

Since the lead terminals of the IC device to be tested will not contact the lead press during the process of sliding to the test position, the solder material will not be abraded from the lead terminals of IC devices. Thus, there is no accumulation of the solder material on the lead press. Thus, it is possible to accomplish the electric contact with high reliability.

What is claimed is:

1. A lead press mechanism for use in a self-drop type test handler for testing IC devices in combination with an IC tester, comprising:

an IC device interface assembly for interfacing an IC device to be tested with an IC tester through IC socket terminals to provide test signals from said IC tester to said IC device and to send resulting output signals from said IC device to said IC tester, said IC device being a mold-frame type device in which each lead extended from a package of said IC device being connected with one another by an insulating material to form a mold-frame;

a lead press assembly having a guide mechanism which includes a contact rail for guiding said IC device in a vertical direction to a predetermined test position in a manner that said mold-frame slides on a surface of said contact rail without allowing said lead to contact said contact rail, a lead press for pressing lead terminals of said IC device against said IC socket terminals by protruding beyond said contact rail when said IC device is placed at said test position, and an elastic member for elastically allowing said lead press an additional movement toward said IC device interface assembly against the force of said elastic member; and a distance mechanism for determining a distance between said IC device interface assembly and said lead press assembly when said when IC device interface assembly and said lead press assembly engage with each other.

2. A lead press mechanism as defined in claim 1, wherein said IC device interface assembly and said lead press assembly are separated when said IC device slides in said vertical direction to said test position, and said IC device interface assembly and said lead press assembly are engaged with each other when said IC device is in said test position to receive said test signal from said IC tester.

3. A lead press mechanism as defined in claim 1, wherein said distance mechanism first engages with said lead press assembly when said IC device interface assembly and said lead press assembly come close together, said distance mechanism restrict said lead press assembly from further approaching toward said IC device interface assembly.

4. A lead press mechanism as defined in claim 3, wherein said lead press protrudes beyond said contact rail against the force of said spring when said lead press assembly is further pressed toward said IC device interface assembly after being restricted its movement by said distance mechanism.

5. A lead press mechanism as defined in claim 1, wherein said IC device interface assembly and said lead press assembly are aligned in a horizontal direction which is substantially perpendicular to said vertical direction in which said IC device slides by its gravity.

6. A lead press mechanism as defined in claim 1, wherein said IC device interface assembly further includes an IC socket, said IC socket terminals are provided on said IC socket.

7. A lead press mechanism as defined in claim 1, wherein said distance mechanism is a rail pressure provided on said IC device interface assembly.

8. A lead press mechanism as defined in claim 1, wherein said distance mechanism is provided separately from said IC device interface assembly.

9. A lead press mechanism as defined in claim 1, wherein said distance mechanism is provided separately from said lead press assembly.

10. A lead press mechanism as defined in claim 1, wherein said lead press assembly further includes a contact base, said lead press is directly coupled with said contact base while indirectly coupled with said contact rail through said spring.

11. A lead press mechanism as defined in claim 1, wherein said lead press assembly further includes a shaft which supports said spring.

12. A lead press mechanism as defined in claim 1, wherein said IC device interface assembly is fixed to said test handler while said lead press assembly is moveable in a horizontal direction to engage or disengage with said IC device interface assembly.

13. A lead press mechanism as defined in claim 1, wherein said lead press assembly is fixed to said test handler while said IC device interface assembly is moveable in a horizontal direction to engage or disengage with said lead press assembly.

14. A lead press mechanism as defined in claim 1, wherein said guide mechanism further includes a contact roof in parallel with said contact rail so that said IC device slides between said contact roof and said contact rail in said vertical direction.

15. A lead press mechanism for use in a self-drop type test handler for testing IC devices in combination with an IC tester, comprising:

an IC device interface assembly (14) for interfacing an IC device (27) to be tested with an IC tester through IC socket terminals (13) to provide test signals from the IC tester to the IC device (27) and to send resulting output signals from the IC device (27) to the IC tester, said IC device being a mold-frame type in which each lead extended from a package of said IC device is connected with one another by an insulating material to form a mold-frame;

a lead press assembly (28) to be coupled with the IC device interface assembly (14) when testing the IC device;

a contact roof (21) and a contact rail (22) provided in the lead press assembly (28) for guiding the IC device (27) to slide in a vertical direction to a predetermined test position by the gravity in a manner that said mold-frame slides on a surface of said contact rail without allowing said lead to contact said contact rail;

a contact base (25) provided in the lead press assembly (28) is indirectly coupled to the contact rail (22) through a spring (24) and a lead press (26) is directly coupled with the contact base (25); and a rail pusher (11) to push a contact rail (22) against the IC device interface assembly (14).

16. A lead press mechanism as defined in claim 15, wherein the spring (14) is supported by a shaft (23), the contact rail (22) is restricted by the rail pressure (11) when the rail pressure (11) when the rail pressure (11) contacts with the lead press assembly (28), said spring (14) allows a further movement of the lead press (26) when lead press assembly (28) is further pressed toward IC device interface assembly (24) thereby pressing the lead terminals of the IC device (27) by the lead press (26) protruded over the contact rail (22).

17. A lead press mechanism for use in a self-drop type test handler for testing IC devices in combination with an IC tester, comprising:

a contact roof (21) and a contact rail (22) guiding an IC device (27) to a specific position by the action of gravity;

a shaft (23) with which the contact rail (22) is fixed on a contact base (25) through a spring (24), and a lead press (26), being isolated from said contact roof (21) and said contact rail (22), and providing a supporting pedestal for the IC device (27);

an IC device interface assembly (14) making contacts to IC tester measurement circuits by installation at fixed position against the lead press assembly (28);

a rail pusher (11) to push a contact rail (22) against said IC device interface assembly (14); and IC socket terminals (13) of an IC socket (12) pressed to lead terminals of the IC device (27) to make contacts;

wherein said IC device is a mold-frame type device in which each of said lead terminals extended from a package of said IC device is connected with one another by an insulating material to form a mold-frame, and said IC device is guided by said contact roof (21) and contact rail (22) in a manner that said mold-frame slides on a surface of said contact rail without allowing said lead terminals to contact said contact roof or contact rail.

18. A lead press mechanism for use in a self-drop type test handler for testing IC devices in combination with an IC tester, comprising:

a contact roof (21) and a contact rail (22) guiding a mold-framed IC device (27), to a specific position by self-dropping through the action of gravity, said mold-frame IC device having lead terminals which are connected with one another by an insulating material forming a mold-frame at ends opposite to a package of said IC device and being guided by said contact roof (21) and contact rail (22) in a manner that said mold-frame slides on a surface of said contact rail without allowing said lead terminals to contact said contact roof or contact rail;

a shaft (23) with which the contact rail (22) is fixed on a contact base (25) through a spring (24);

a lead press (26) being separated from said contact roof (21) and said contact rail (22), and providing a support pedestal for said lead terminals (49) of the mold-framed IC device (27);

an IC device interface assembly (14) making contacts with IC tester measurement circuits by installation at fixed positions against the lead press assembly (28);

a rail pusher (11) to push a contact rail (22) against said IC device interface assembly (14);

IC socket terminals (13) of an IC socket (12) being pressed to said lead terminals (49) of the mold-framed IC device to make contacts.

* * * * *